(12) United States Patent
Wong et al.

(10) Patent No.: US 6,749,100 B2
(45) Date of Patent: Jun. 15, 2004

(54) MULTIPLE-HEAD WIRE-BONDING SYSTEM

(75) Inventors: Yam Mo Wong, Singapore (SG); Keng Yew Song, Singapore (SG); Ka Shing Kwan, Singapore (SG); Hon Yu Ng, Singapore (SG); Tin Kwan Chan, Singapore (SG)

(73) Assignee: ASM Technology Singapore Pte Ltd. (SG)

( * ) Notice: Subject to any disclaimer, the term of this patent is extended or adjusted under 35 U.S.C. 154(b) by 0 days.

(21) Appl. No.: 09/996,293

(22) Filed: Nov. 28, 2001

(65) Prior Publication Data

US 2003/0098340 A1 May 29, 2003

(51) Int. Cl.⁷ .................... B23K 37/00; B23K 31/00; B23K 31/02
(52) U.S. Cl. ........................... 228/4.5; 228/180.5
(58) Field of Search ................ 228/4.5, 180.5, 228/1.1, 6.1

(56) References Cited

U.S. PATENT DOCUMENTS

| | | | | |
|---|---|---|---|---|
| 3,840,169 A | * | 10/1974 | Steranko et al. | 228/4.1 |
| 3,841,546 A | * | 10/1974 | Ozimec | 228/6.2 |
| 4,301,958 A | * | 11/1981 | Hatakenaka et al. | 228/4.5 |
| 4,407,416 A | * | 10/1983 | Anderson | 211/41.17 |
| 4,595,820 A | * | 6/1986 | Richardson | 219/137 PS |
| 4,821,944 A | * | 4/1989 | Tsumura | 228/110.1 |
| 4,890,780 A | * | 1/1990 | Mimata et al. | 228/4.5 |
| 4,930,086 A | * | 5/1990 | Fukasawa | 700/116 |
| 4,985,804 A | * | 1/1991 | Campbell et al. | 361/687 |
| 5,189,507 A | * | 2/1993 | Carlomagno et al. | 257/777 |
| 5,530,284 A | * | 6/1996 | Bailey | 257/670 |
| 5,680,294 A | * | 10/1997 | Stora et al. | 361/695 |
| 5,839,640 A | * | 11/1998 | Kinnaird | 228/4.5 |
| 5,979,739 A | * | 11/1999 | Jin et al. | 228/6.2 |
| 6,108,204 A | * | 8/2000 | Brotherton et al. | 361/704 |

FOREIGN PATENT DOCUMENTS

JP        05-218124 A   *   8/1993

* cited by examiner

Primary Examiner—L. Edmondson
(74) Attorney, Agent, or Firm—Ostrolenk, Faber, Gerb & Soffen, LLP (57) ABSTRACT

The invention provides a wire-bonding apparatus for forming electrical connections between a semiconductor chip and a leadframe, comprising a plurality of bond-heads associated with a plurality of work holders on said wire bonding apparatus for holding a plurality of leadframes, wherein each bond-head of the apparatus is capable of independent bonding operation simultaneously with the other bond-heads, without synchronization of movement with the other bond-heads.

22 Claims, 6 Drawing Sheets

MULTIPLE-HEAD WIRE-BONDING SYSTEM

FIELD OF THE INVENTION

The invention relates to a wire-bonding system for bonding the contacts of semiconductor chips to leadframes, and in particular, to wire-bonding systems with multiple bond heads.

BACKGROUND AND PRIOR ART

In the process of forming a semiconductor integrated circuit package, wire-bonders are commonly used to bond wires, for example, copper or gold wires on electrical contacts on semiconductor chips and corresponding leadframe leads in order to electrically connect the contacts on semiconductor chips to the leads on leadframes. Thereafter, the semiconductor chip is encapsulated with epoxy resin to form semiconductor packages and then each package is singulated. The wire-bonders include bond-heads comprising ultrasonic transducers, that use high-frequency vibrations to affix the wires to the contacts and leadframes.

Traditionally, wire-bonders have used single bond-heads due to the simplicity of implementation. Single bond heads avoid the problem of interference caused by multiple bond-heads, which would lead to inaccurate bonding if vibrations caused by one bond-head working on one work holder reverberates to an adjacent bond-head and work holder. Further, a single bond-head leads to a less complicated design in terms of machinery and work-flow.

Nevertheless, the use of single bond-heads have certain shortcomings. One disadvantage is that single-head wire-bonders lead to greater footprints if several wire-bonder machines are to be implemented. Thus, if multiple wire-bonders are implemented in an in-line system, valuable floor-space is wasted as a result of the larger foot-print. Further, having single bond-heads slows down the wire-bonding process if, for instance, different bonding processes like alternate patterns or different wire sizes are to be performed on the same leadframe. If the wire-bonder has multiple bond-heads on the same system that are substantially adjacent to each other, the different bonding processes can be carried out consecutively with less transportation time required to transfer the leadframe from one bond-head to another.

SUMMARY OF THE INVENTION

Thus, the invention seeks to provide an improved wire-bonding system comprising multiple bond-heads to avoid some of the disadvantages of the prior art consisting of single bond-head systems.

Accordingly, the invention provides a wire-bonding apparatus for forming electrical connections between a semiconductor chip and a leadframe, comprising a plurality of bond-heads associated with a plurality of work holders on said wire bonding apparatus for holding a plurality of leadframes, wherein each bond-head of the apparatus is capable of independent bonding operation simultaneously with the other bond-heads, without synchronization of movement with the other bond-heads.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

DETAILED DESCRIPTION OF THE PREFERRED EMBODIMENT OF THE INVENTION

Figure 1:
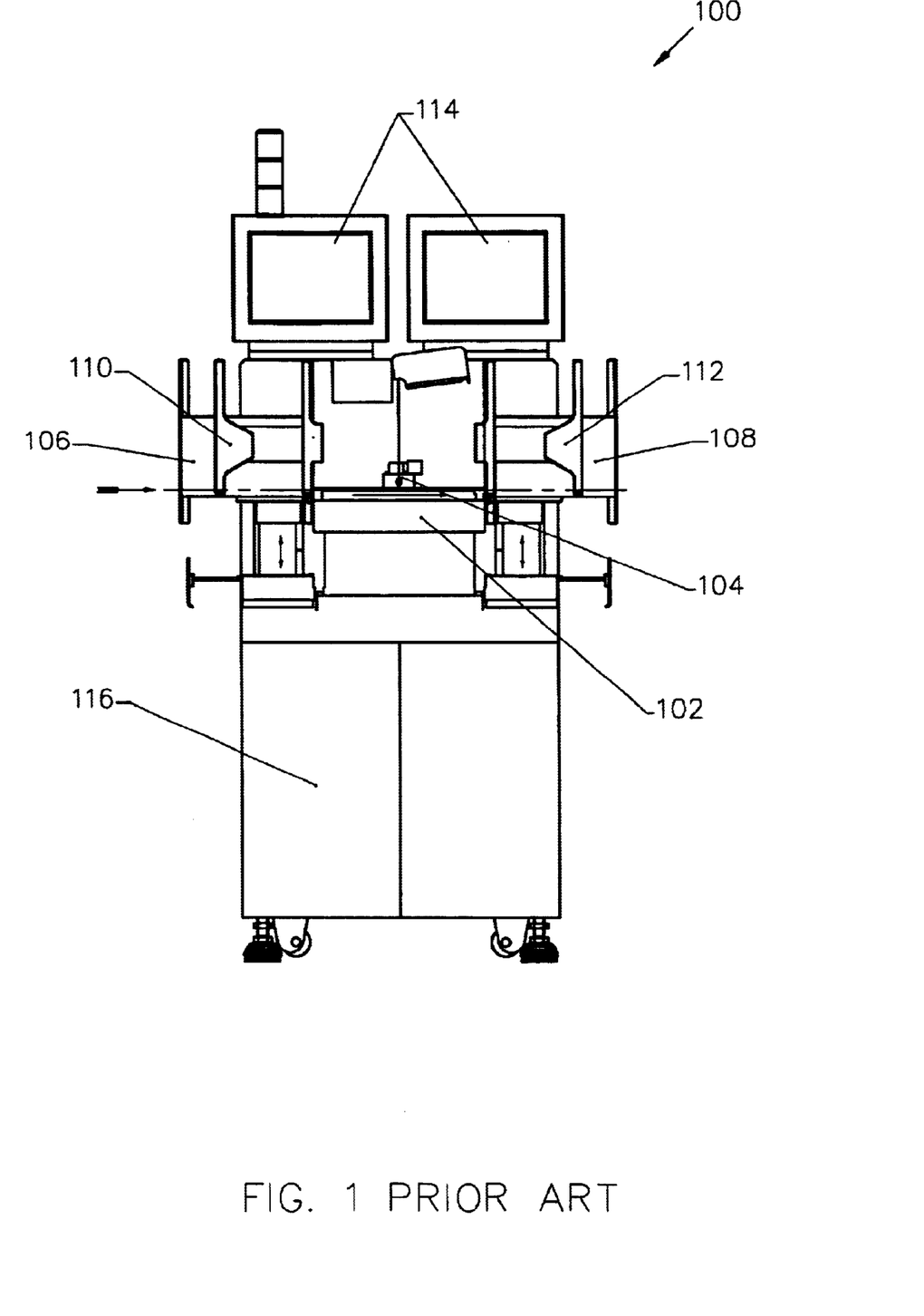
FIG. 1 is a front elevation view of a single-lead wire-bonder of the prior art.

FIG. 1 is a front elevation view of a single head wire-bonder 100 of the prior art. The single-head wire-bonder 100 has a work holder 102 located substantially centrally on the single-head wire-bonder 100 for holding and indexing leadframes during the wire-bonding process. Wires are bonded to the leadframes using bond-head 104, commonly an ultrasonic transducer, in a process referred to as wedge bonding. The single-head wire-bonder 100 that is illustrated has a stand-alone configuration, and therefore, magazines 106, 108 can be used to store unprocessed as well as processed leadframes. Unprocessed leadframes may be stored in the left magazine 106 supported by a left elevator 110, whereas processed leadframes can be stored in the right magazine 108 supported by a right elevator 112.

There is optionally a set of computer monitors 114 to monitor the progress of the wire-bonding as well as to assist in setting the parameters for the wire-bonds. The foregoing components sit on a lower chassis with a cardcage 116.

Figure 2:
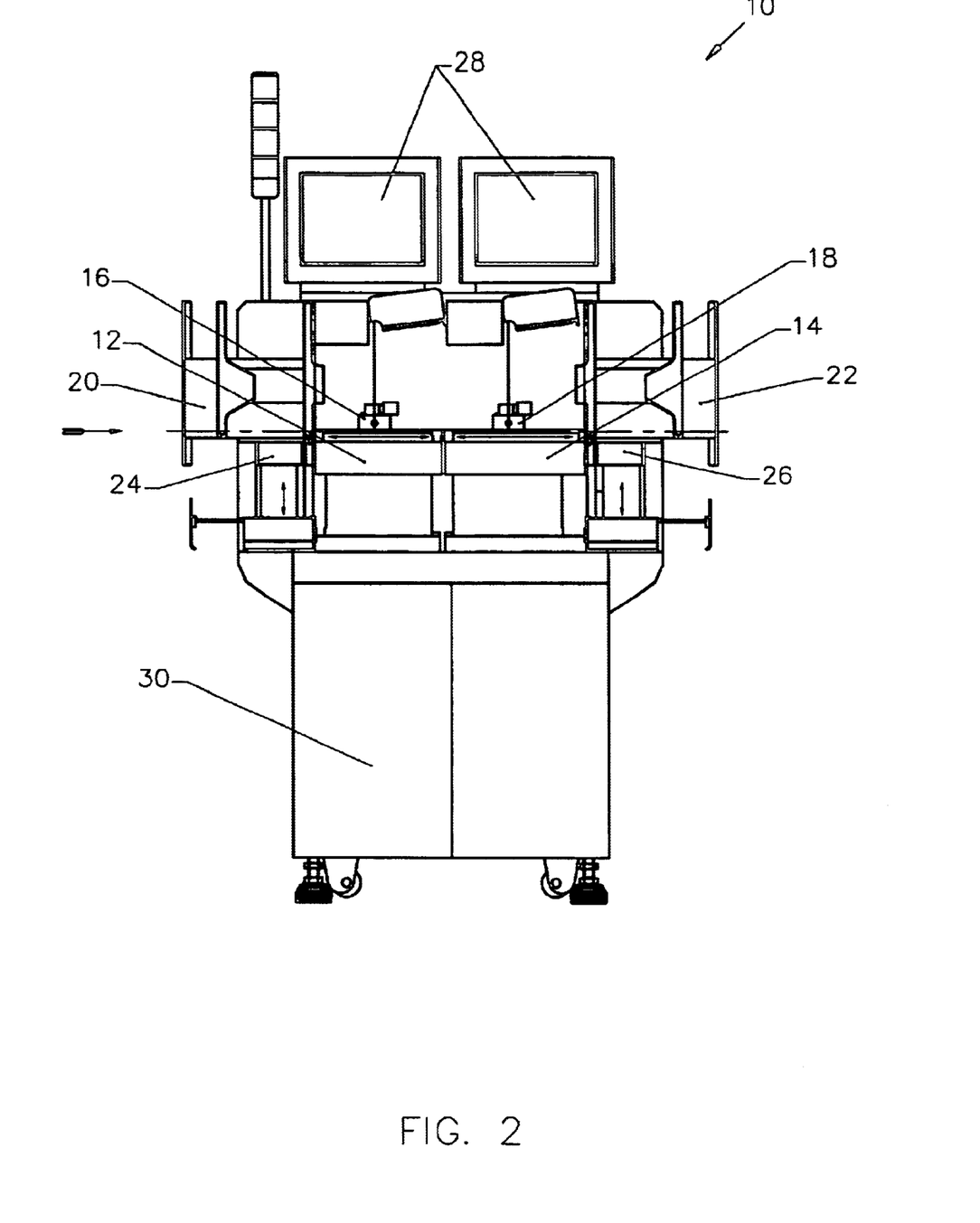
FIG. 2 is a front elevation view of a twin-head wire bonder according to a preferred embodiment of the invention.

FIG. 2 is a front elevation view of a twin-head wire-bonder 10 according to a preferred embodiment of the invention. The wire-bonder 10 has two work holders 12, 14 positioned adjacent to each other. The work holders 12, 14 can each hold and index a leadframe such that two leadframes may be proposed simultaneously. The work holders can be indexed in the x-axis. There are two bond-heads 16, 18, each of which is positioned above a work holder 12, 14, for wiring the semiconductor chips located on each leadframe. The bond-heads 16, 18 are movable in the x- and y-axes. Although for ease of understanding the invention, only two bond heads are illustrated in the preferred embodiment, it would be appreciated that the apparatus can be manufactured with more than two bond-heads associated with more than two work holders.

Each bond-head 16, 18 is controlled by a separate controller board so that it is capable of independent bonding operation, although the bond-heads are operated simultaneously. Thus the bond-heads 16, 18 are capable of simultaneous bonding of different types of wires. For example, one bond-head could conduct bonding with gold wires and another bond-head could simultaneously conduct bonding with copper wires, or wires of different diameters could be used by different bond-heads at the same time. Further, each bond-head could conduct bonding with a different pattern.

Due to the vibrations that would be generated by the simultaneously ongoing bonding processes, it is desirable to leave a gap between the work holders 12, 14 so that vibration caused on one work holder will not affect the accuracy of bonding on the other. Each of the work holders 12, 14 rests on a separate base platform, wherein each base platform is separated from another by a gap. Each base platform is in turn separated from direct contact with a common lower chassis on which it rests by a vibration-insulating material to minimize transmission of vibration from one base platform to the other.

FIG. 2 illustrates the wire-bonder 10 with a stand-alone configuration, such that storage means, such as magazines 20, 22 can be used to store unprocessed leadframes in one magazine 20 as well as processed leadframes in the other magazine 22. The left magazine 20 is supported by a left elevator 24 and the right magazine 22 is supported by a right elevator 26. Each magazine 20, 22 has a plurality of slots (not shown) aligned with the orientation of the leadframes when they are being transported, each of the slots being designed to store a leadframe. The left and right elevators 24, 26 raise and lower the left and right magazines 20, 22 When a leadframe stored in the magazine 20 is elevated to register with the work holders 12, 14, a kicker mechanism pushes the leadframe out of the left magazine 20 and onto the left work holder 12. The leadframe may also be moved to the right work holder 14 for wire-bonding to be performed there. After wire-bonding has been performed, there is another kicker mechanism adjacent to the right work holder 14 to push the processed leadframe into an empty slot in the right magazine 22 for storage. Each slot of the magazine 22 is elevated in turn by the right elevator 26 to register with the right work holder 14 consecutively until the magazine 22 is filled.

Optionally, the wire-bonder 10 may include computer monitors 28 to monitor the progress of the wire-bonding as well as assisting in setting the parameters for the wire-bonds. The foregoing components sit on a lower chassis with a cardcage 30. It would be appreciated that the foot-print of the twin-head wire-bonder 10 (as determined by the base area of the lower chassis) is substantially similar to that of the single-head wire-bonder 100 although the capacity of the wire bonder 10 has been increased, thus reducing the foot-print that would previously be required for two single-head wire-bonders 100.

Figure 3:
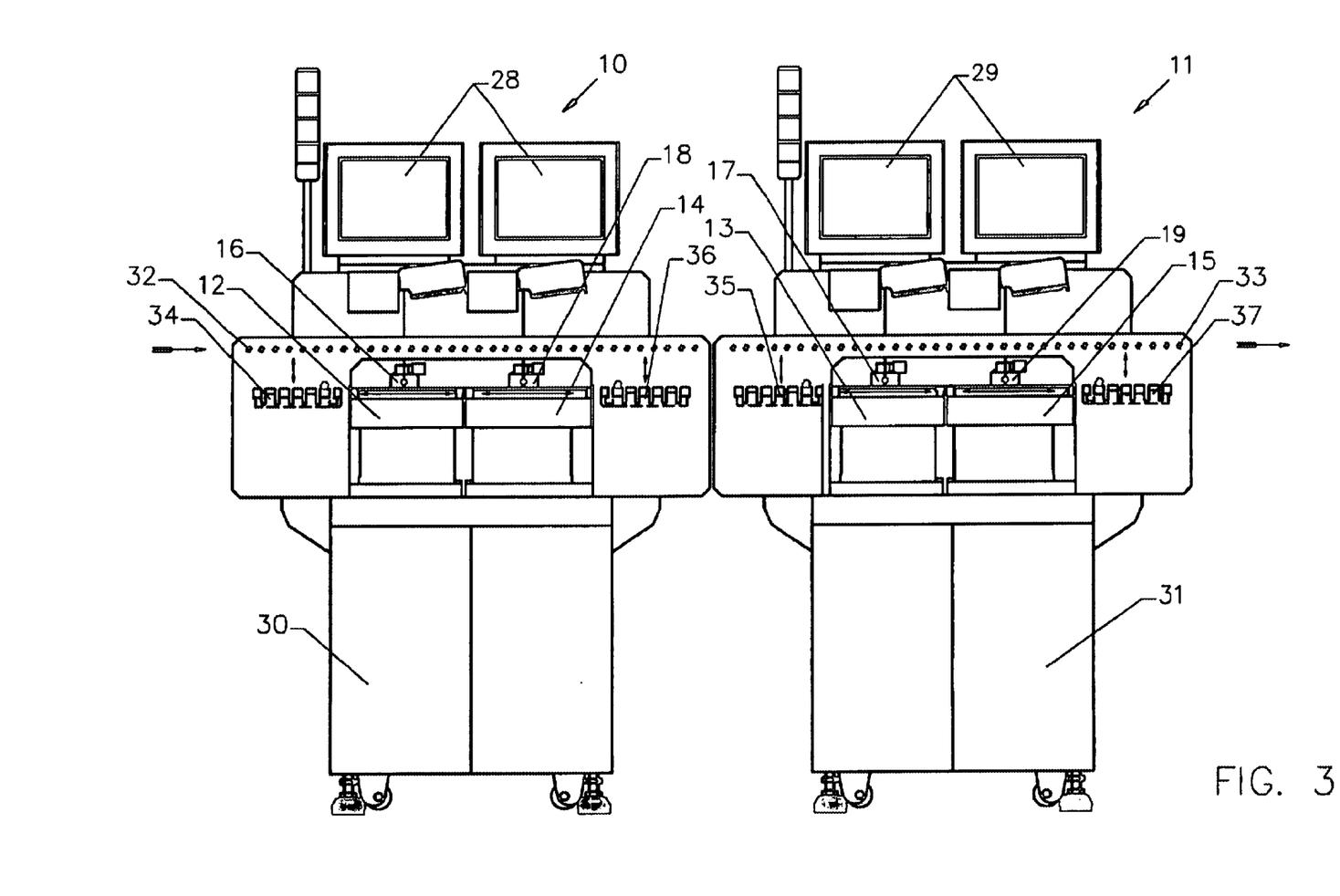
FIG. 3 is a front elevation view of two twin-head wire-bonders configured adjacent to each other as part of an in-line system for the assembly of semiconductor packages according to another embodiment of the invention.

FIG. 3 is a front elevation view of two twin-head wire-bonders 10, 11 configured adjacent to each other as part of an in-line system for the assembly of semiconductor packages according to another preferred embodiment of the invention. The difference between an in-line system and a stand-alone system is that in the in-line system, leadframes are transported directly from one processing machines (such as a die-bonder, wire-bonder, moulding machine and inspection machine) to another. Therefore, magazines are not necessary to store leadframes for transportation between one machine or set of machines to another.

The second twin-head wire-bonder 11 has similar work holders 13, 15 and bond-heads 17, 19 positioned above the work holders 13, 15. There may also optionally be computer monitors 29 to monitor the progress of the wire-bonding and to assist in setting parameters for the process. The components are similarly supported on a lower chassis and cardcage 31.

However, in this in-line configuration, there is no need for magazines 20, 22 or the left and right elevators 24, 26 which are preferable in the stand-alone configuration. Instead a line transporter 38 (see FIG. 5) including a series of rollers 32, 33 is used to transport leadframes from one machine to another. Other processing machines in the in-line (not shown) would preferably have similar line transporters 38 to receive or transfer leadframes to be processed. As it is preferable to have more than one transport path for the leadframes, as will be explained in more detail below, transport arms 34, 35, 36, 37 may be used to carry leadframes from one transport path to the other.

Figure 4:
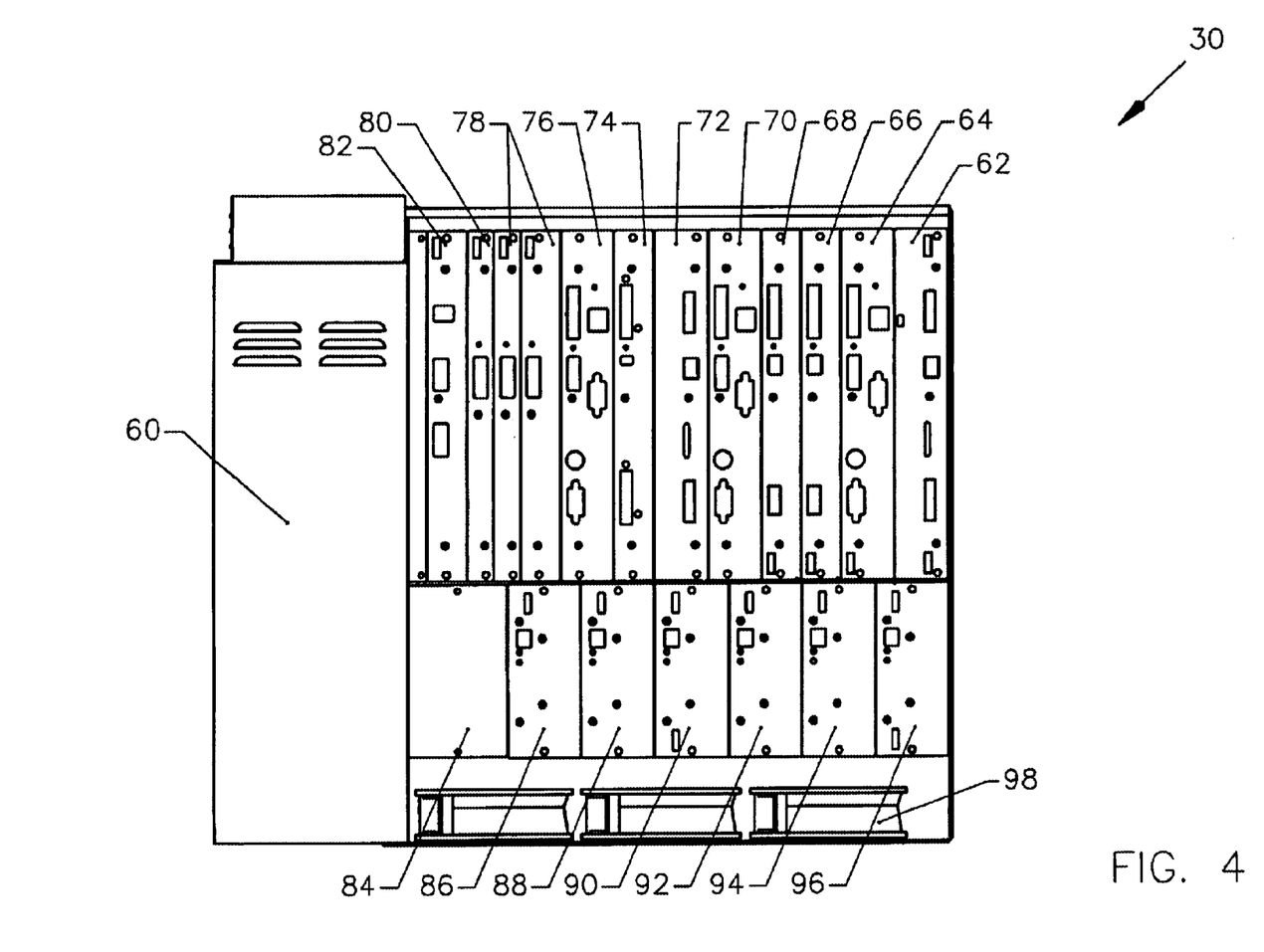
FIG. 4 is a front view of a cardcage usable with the preferred embodiments of the invention.

FIG. 4 is a front view of a cardcage 30 usable with the preferred embodiment of the invention. There is a main computer 60 with a microprocessor for controlling the functions of the various components that are stored in the cardcage. The components will be described in turn.

The cardcage 30 includes a right Z-movement driver 62, a right XYZ board with an embedded computer 64, and right input/output Bond Quality Monitoring board 66 to control bonding on the right side. Correspondingly, there is a left input/output Bond Quality Monitoring board 68, left XYZ board with an embedded computer 70 and left input Z-movement driver 72 to control bonding on the left side. The advantage of having embedded computers (not shown) on the XYZ boards 64, 70 is that the processes can run faster and more efficiently, and take up less space as compared to having a separate dedicated personal computer to control the boards.

In addition, the cardcage 30 includes a work holder board 74 with embedded computer, an AC and stepper board 76, two Low Voltage quad stepper boards 78 and a high voltage quad stepper board 80. There is also a solenoid driver 82 and a switch mode power supply 84. There are left and right I-drivers 86, 88 with heat sinks, left and right X-drivers 90, 92 with heat sinks and left and right Y drivers 94, 96 with head sinks. Advantageously, the cardcage 30 should also be installed with a number of cooling fans 98.

The need for heat sinks with the drivers 86–96 and cooling fans arises because of the compact design of the cardcage 30. In previous designs of the cardcage 30, the drivers were located away from the cardcage 30 and closer to the moving components. Further, the cardcage 30 formerly only had to contain sufficient hardware to run one wire-bonder. Now, there must be sufficient hardware to run two wire-bonders. Therefore, considerably more heat is generated and the cooling system needs to be correspondingly improved to dissipate heat away from the cardcage 30 and the components inside quickly and efficiently.

Figure 5:
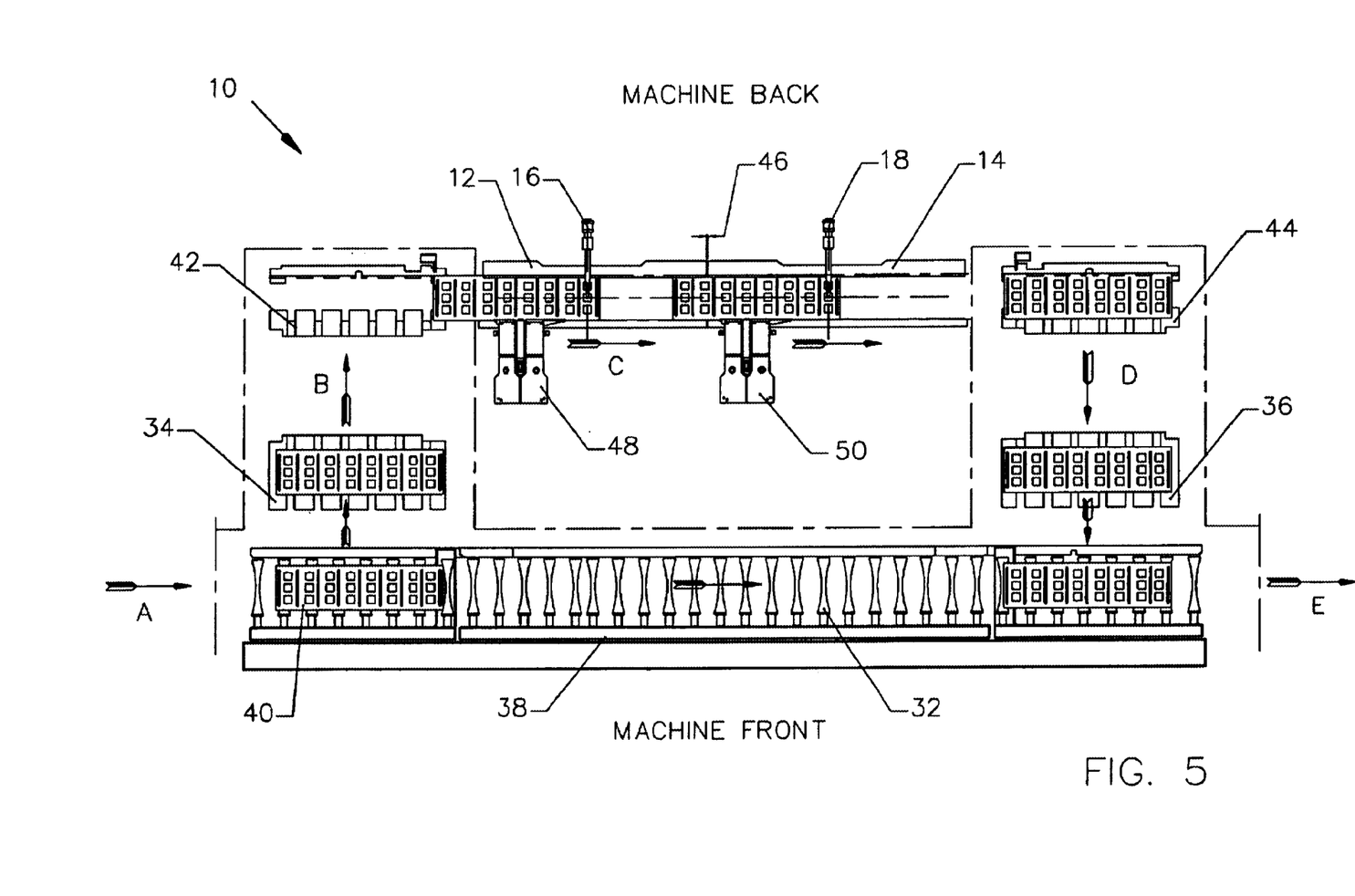
FIG. 5 is a schematic plan view of a twin-head wire-bonder that illustrates one work-flow configuration for the wire-bonding of leadframes according to the second preferred embodiment of the wire-bonding system.

FIG. 5 is a schematic plan view of twin-head wire-bonder 10 that illustrates one work-flow configuration for the wire-bonding of leadframes 40 according to the second preferred embodiment of the wire-bonding system.

Leadframes 40 enter the twin-head wire-bonder 10 via direction A onto the line transporter 38 having rollers 32 that are controlled by pulleys operated by a central microprocessor overseeing the whole assembly process. At this point, there is an option of transporting the leadframe 40 to proceed directly along direction E. The latter situation would be preferably where, for example, in an in-line system with a plurality of wire-bonders (as in FIG. 3), a leadframe 40 has already been processed by another wire-bonder. If a leadframe 40 is to be processed at this wire bonder 10, the transport arm 34 lifts the leadframe 40 from the line transporter 38 and moves it in direction B towards a left input/output transporter 42.

The work holder 12, 14 may each have a track on which a leadframe 40 is slidable and an indexer 48,50 adjacent the track to grip and position the leadframe 40 relative to each associated bond-head 16, 18, and to slide the leadframe 40 across each work holder 12, 14. At the left input/output transporter 42, the leadframe 40 is gripped by a left indexer 48 and is moved across the track of the left work holder 12 to be positioned under the left bond-head 16 for wire bonding to proceed. Alternatively, the leadframe 40 may be released by the left indexer and gripped by the right indexer 50 to be moved across the track of the right work holder 14 for wire-bonding by the right bond-head 18. If so, the left work holder 12 is able to receive another leadframe 40 for wire-bonding.

After processing, the leadframe 40 is pushed to the right input/output transporter 44 where it is lifted by a right transport arm 36 and moved in direction D to the end of the line transporter 38. The processed leadframe 40 is then carried away from the wire-bonder 10 in direction E to the next machine in the in-line system.

Figure 6:
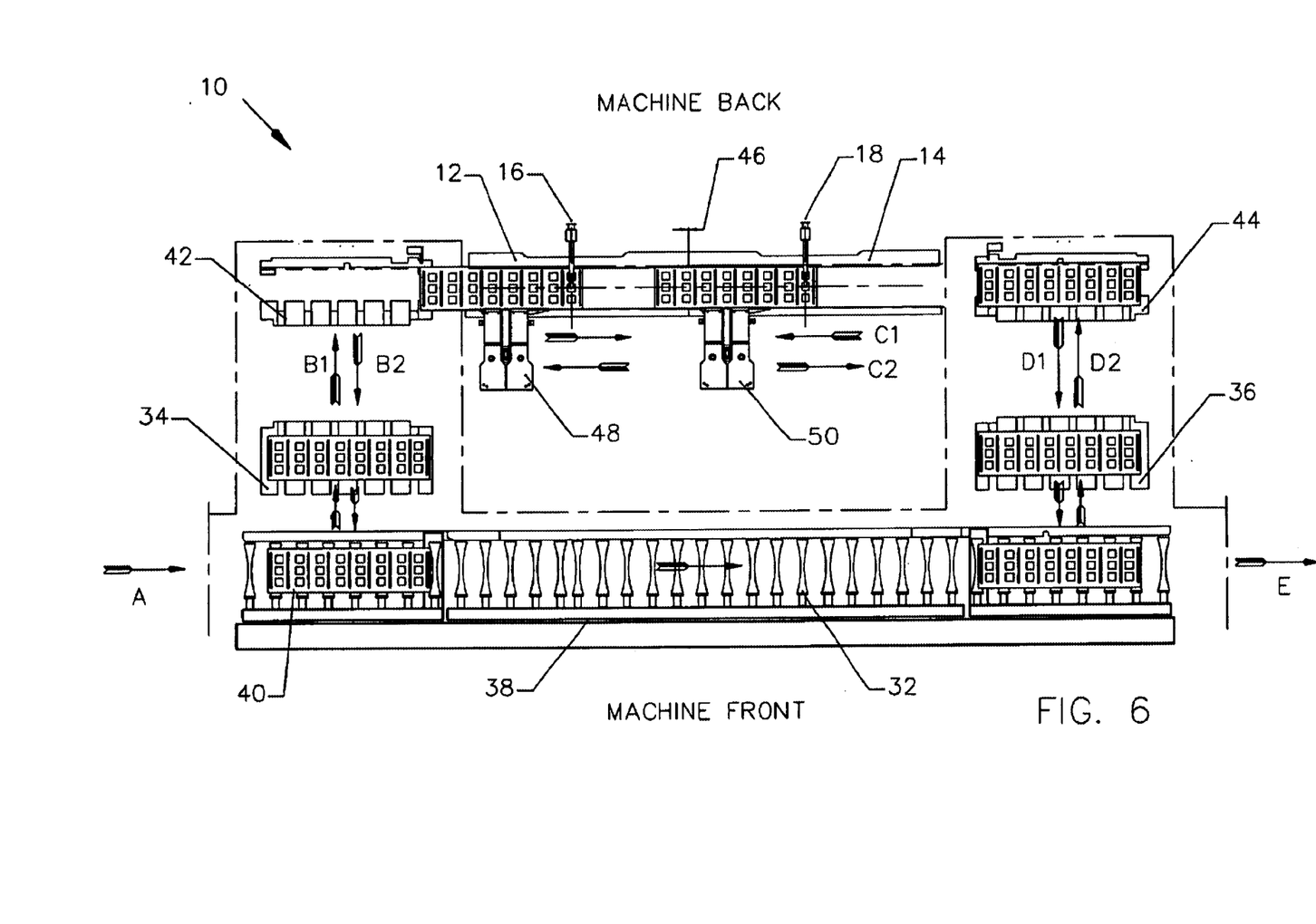
FIG. 6 is a schematic plan view of a twin-head wire-bonder that illustrates another work-flow configuration for the wire-bonding of leadframes as an alternative to FIG. 5.

FIG. 6 is a schematic plan view of a twin-head wire-bonder 10 that illustrates another work-flow configuration for the wire-bonding of leadframes 40, as an alternative to FIG. 5. It illustrates that the wire-bonder 10 is capable of achieving more than one input/output path. In particular, leadframes 40 may be moved in direction B1 or its reverse direction B2 by the left transport arm 34, or in direction C1 or its reverse direction C2 by the indexers 48, 50 of the work holders 12, 14, or in direction D1 or its reverse direction D2 by the right transport arm 36.

One advantage of this capability is that, if one of the work holders 12, 14 is not functional, the other work holder may be used to process leadframes 40 with no need to shut down the whole wire bonder 10. For example, if the left work holder 12 is down, leadframes 40 entering the line transporter 38 from direction A do not have to be moved in direction B1 to the faulty left work holder 12. Instead, the leadframes 40 may proceed further down the line transporter 38 and be moved by the right transport arm 36 to the right work holder 14 via direction D2. The leadframes 40 are then transported to the right work holder 14 via the right input-output transporter 44 in direction C1.

After wire-bonding is completed, the leadframes 40 are moved in the reverse directions C2 and D1, and back to the line transporter 38.

It should be appreciated that the described embodiment of the invention achieves an independent multiple-head bonding system design, and interference between individual bond-heads is minimized.

The invention described herein is susceptible to variation, modifications and/or additions other than those specifically described and it is to be understood that the invention includes all such variations, modifications and/or additions which fall within the spirit and scope of the above description.

What is claimed is:

1. A wire-bonding apparatus for forming electrical connections between a semiconductor chip and a lead frame, comprising:
   a plurality of bond-heads;
   a plurality of work holders, each associated with a respective one of the bond-heads, and configured to support a lead frame in an operative relation to the associated bond-head,
   the bond heads and the work holders being assembled into a single integrated structure; and
   a controller which is programmable to operate each bond-head of the apparatus independently to perform bonding of wires between a semiconductor chip and a leadframe simultaneously with the other bond-heads but without synchronization of movement between the bond-heads.

2. A wire-bonding apparatus according to claim 1, which includes a gap between the work holders on the apparatus to isolate each work holder from the vibration of another work holder.

3. A wire-bonding apparatus according to claim 2, wherein each work holder rests on a base separated from other bases by a gap and each separate base rests on a common lower chassis, the each separate base being separated from the common lower chassis by a vibration-insulating material.

4. A wire-bonding apparatus according to claim 1, wherein each work holder includes a track on which a leadframe is slideable, and an indexer adjacent the track to grip and position the leadframe relative to each associated bond-head and to slide the leadframe across each work holder.

5. A wire-bonding apparatus according to claim 1, including a storage device in which leadframes are storable and which is operatively connected with the apparatus to automatically provide leadframes to the workholder and/or to automatically receive leadframes that have been processed.

6. A wire-bonding apparatus according to claim 1, including a transportation system comprising a line transporter having rollers that move the leadframes along their designated direction of travel.

7. A wire-bonding apparatus according to claim 6, which includes a transport arm for lifting a leadframe away from the line transporter to a designated location such that the leadframe is substantially adjacent the work holder, for transfer to the work holder.

8. A wire-bonding apparatus according to claim 6, wherein the transportation system is capable of transporting a leadframe to each work holder for processing and of transporting each processed leadframe away from a work holder without passing through another work holder.

9. A wire-bonding apparatus according to claim 7, wherein each transport arm allows bi-directional movement of leadframes away from and/or towards the line transporter.

10. A wire-bonding apparatus according to claim 1, which includes a cardcage for storing electrical and/or electronic components of the controller and devices to drive mechanical components of the apparatus.

11. A wire-bonding apparatus according to claim 10, wherein each bond-head is controlled by a separate controller board housed in the cardcage.

12. A wire-bonding apparatus according to claim 11, wherein each controller board includes a heat-sink.

13. A wire-bonding apparatus according to claim 10, wherein the cardcage includes cooler fans to lower the temperature inside the cardcage.

14. A wire-bonding apparatus according to claim 1, wherein the controller is programmable to operate the plurality of bond-heads to simultaneously perform bonding of wires of different types.

15. A wire-bonding apparatus according to claim 14, wherein the different types of wires include gold wires and copper wires.

16. A wire-bonding apparatus according to claim 14, wherein the different types of wires include different wires of different diameters.

17. A wire-bonding apparatus according to claim 1, wherein the controller is programmable to operate different bond-heads to perform bonding according to different patterns simultaneously.

18. A wire-bonding apparatus according to claim 1, further including a structure operative to isolate each work holder from vibration of the other work holders.

19. A wire-bonding apparatus according to claim 1, each of the bonding-heads includes an ultrasonic transducer by which the bonding operations are performed.

20. A wire-bonding apparatus according to claim 19, wherein vibration isolation is provided by gap between the work holders on the apparatus to isolate each work holder from the vibration of another work holder.

21. A wire bonding apparatus according to claim 19, wherein:

each work holder rests on a separate base and each separate base rests on a common lower chassis, and vibration isolation is achieved by the respective bases being separated from each other by a gap, and from the common lower chassis by a vibration-insulating material.

22. A wire-bonding apparatus for forming electrical connections between a semiconductor chip and a lead frame, comprising:

a plurality of bond-heads each including an ultrasonic transducer;

a plurality of work holders, each associated with a respective one of the bond-heads, and configured to support a lead frame in an operative relation to the associated bond-head, the bond heads and the work holders being assembled into a single integrated structure; and a controller which is programmable to operate each bond-head of the apparatus independently to perform bonding of wires between a semiconductor chip and a leadframe simultaneously with the other bond-heads but without synchronization at movement between the bond-heads.

* * * * *